(12) United States Patent
Woodford et al.

(10) Patent No.: US 7,808,324 B1
(45) Date of Patent: Oct. 5, 2010

(54) OPERATING ENVIRONMENT AND PROCESS POSITION SELECTED CHARGE-PUMP OPERATING MODE IN AN AUDIO POWER AMPLIFIER INTEGRATED CIRCUIT

(75) Inventors: Scott Allan Woodford, Austin, TX (US); Daniel John Allen, Austin, TX (US); Eric J. Swanson, Buda, TX (US)

(73) Assignee: Cirrus Logic, Inc., Austin, TX (US)

( * ) Notice: Subject to any disclaimer, the term of this patent is extended or adjusted under 35 U.S.C. 154(b) by 15 days.

(21) Appl. No.: 12/405,485

(22) Filed: Mar. 17, 2009

(51) Int. Cl.
*H03F 3/04* (2006.01)

(52) U.S. Cl. ...................................... 330/297; 330/296

(58) Field of Classification Search .................. 330/297, 330/296, 285
See application file for complete search history.

(56) References Cited

U.S. PATENT DOCUMENTS

| | | | |
|---|---|---|---|
| 4,873,493 A | 10/1989 | Fujiwara | |
| 5,289,137 A * | 2/1994 | Nodar et al. ................. | 330/296 |
| 5,442,317 A | 8/1995 | Stengel | |
| 6,104,248 A | 8/2000 | Carver | |
| 6,304,138 B1 | 10/2001 | Johnson | |
| 6,586,992 B1 | 7/2003 | Strakovsky | |
| 6,636,103 B2 * | 10/2003 | Wurcer et al. ................ | 327/536 |
| 6,836,133 B2 | 12/2004 | Kinoshita | |
| 7,031,457 B2 | 4/2006 | Melsa | |
| 7,100,058 B1 * | 8/2006 | Tomlinson et al. .......... | 713/300 |
| 7,166,992 B2 | 1/2007 | Kudo et al. | |
| 7,183,857 B2 | 2/2007 | Doy et al. | |
| 7,239,163 B1 | 7/2007 | Ralston-Good et al. | |
| 7,375,540 B2 | 5/2008 | Burns et al. | |
| 2008/0044041 A1 * | 2/2008 | Tucker et al. ............... | 381/120 |
| 2008/0144861 A1 | 6/2008 | Melanson et al. | |

FOREIGN PATENT DOCUMENTS

| | | |
|---|---|---|
| DE | 19858963 A1 | 7/2000 |
| DE | 10140285 A1 | 2/2003 |
| GB | 2360410 A | 9/2001 |

OTHER PUBLICATIONS

Phillips Semiconductor, TDA 1562Datasheet, Feb. 12, 2003, NL.

* cited by examiner

*Primary Examiner*—Henry K Choe
(74) *Attorney, Agent, or Firm*—Andrew M. Harris; Mitch Harris, Atty at Law, LLC

(57) ABSTRACT

A charge pump power supply for an audio power amplifier integrated circuit has an operating mode selected according to an indication of operating environment and/or a process position of the integrated circuit. The operating mode selects the output voltage provided by the charge pump and may also select efficiency by selecting a frequency of operation of the charge pump and/or the effective size of a switching transistor bank. The selection is made in conformity with an indication of a process position of the integrated circuit and/or an indication of an environment of the integrated circuit, such as temperature, power supply voltage and/or load impedance values, and generally also in conformity with a volume (gain) setting, or a detected signal level, so that internal power consumption of the amplifier and charge pump is reduced when a high signal level is not being reproduced at the audio power stage.

21 Claims, 6 Drawing Sheets

OPERATING ENVIRONMENT AND PROCESS POSITION SELECTED CHARGE-PUMP OPERATING MODE IN AN AUDIO POWER AMPLIFIER INTEGRATED CIRCUIT

CROSS-REFERENCE TO RELATED APPLICATIONS

The present U.S. Patent Application is related to co-pending U.S. patent application Ser. No. 11/610,496 entitled "ENERGY-EFFICIENT CONSUMER DEVICE AUDIO POWER OUTPUT STAGE" filed on Dec. 13, 2006, having at least one common inventor and assigned to the same Assignee, and which was published as U.S. Published Patent Application US2008/0044041. The present U.S. Patent Application is also related to co-pending U.S. patent application Ser. No. 12/355,839, filed on Jan. 19, 2009 and entitled "SIGNAL LEVEL SELECTED EFFICIENCY IN A CHARGE PUMP POWER SUPPLY FOR A CONSUMER DEVICE AUDIO POWER OUTPUT STAGE", having at least one common inventor and assigned to the same Assignee. The disclosures of the above-referenced U.S. Patent Applications are incorporated herein by reference.

BACKGROUND OF THE INVENTION

1. Field of the Invention

The present invention relates generally to consumer device audio power output stages, and more specifically, to a circuit that selects the efficiency of a charge-pump power supply within an audio amplifier integrated circuit based on the amplifier's operating environment and/or process position of the integrated circuit.

2. Background of the Invention

In battery-operated consumer audio devices, the power amplifier output, which is generally utilized to drive a pair of headphones or a speaker, can be the primary consumer of battery power. In devices having a linear power amplifier for the output stage, power is wasted during low signal level outputs, since the voltage drop across the active output transistor plus the output voltage will be equal to the constant power supply rail voltage. Therefore, amplifier topologies such as Class-G and Class-H are desirable for reducing the voltage drop across the output transistor(s) and thereby reducing the power wasted in dissipation by the output transistor(s).

In order to provide a changeable power supply voltage to such a power amplifier, a charge pump power supply may be used, such as that disclosed in the above-incorporated U.S. Patent Application, in which an indication of the signal level at the output of the circuit is used to control the power supply voltage. The above-described topology will raise the efficiency of the audio amplifier, in general, as long as periods of low signal level are present in the audio source. Since the minimum voltage drop across each output transistor of the amplifier is relatively large for small signal levels, the power supply voltage supplied to the power amplifier can be reduced during times that the signal level is low. The power supply voltage can then be increased just before additional voltage is needed at the amplifier power supply, in order to avoid clipping at the output of the power amplifier.

However, signal level alone does not provide a complete indication of characteristics of the audio amplifier and the circuit environment. For example, the impedance of various transducers that may be connected to the amplifier varies, causing a variation of power level in the transducer for the same output voltage. Further, the supply voltage provided to the integrated circuit may vary from application-to-application or in a given application, which may dictate lower charge-pump device resistances in order to provide a required amplifier operating voltage. Also, process variation of the integrated circuit and the operating temperature affect both the on-resistance of the charge-pump devices and the output resistance of the audio amplifier. Therefore, the amplifier and charge pump must be designed robustly in order to maintain operation without clipping across the specified operating temperature range and a range of process variation for a given production yield. The robustness of the design compromises efficiency, as the amplifier power supply voltage required to reproduce a given audio signal level without clipping increases as the voltage drop in the amplifier power stage increases and that voltage drop is dependent on the environmental and process-dependent factors mentioned above.

Therefore, it would be desirable to provide a charge-pump power supply that supplies power to an audio power amplifier circuit for a consumer audio device, in which the efficiency of the amplifier is improved by changing a power supply voltage supplied to the amplifier, and in which the decision to change the power supply voltage takes into account the operating environment and/or process variation of an integrated circuit including the audio power amplifier.

SUMMARY OF THE INVENTION

Improved efficiency in an audio power amplifier integrated circuit is achieved in an audio power amplifier integrated circuit and its method of operation. The audio power amplifier integrated circuit includes a charge pump power supply that has a selectable operating mode that determines the voltage supplied to the amplifier output stage. The operating mode is selected in conformity with an indication of the amplitude of the signal being amplified by the amplifier, which may be determined from a volume (gain) control setting or by detecting an amplitude of the signal. The threshold used to select the operating mode of the charge pump is determined by one or more on-chip monitors that determine an environment or a position within a process variation range of the audio amplifier integrated circuit. Position within a process variation range is not a physical position, but an indication of values of one or more process-dependent variables for a particular integrated circuit, e.g., a description of how the particular integrated circuit deviates from a nominal integrated circuit for one or more process-dependent circuit parameters.

The monitors may include a process monitor, a temperature monitor, a power supply voltage monitor and a circuit for determining a load impedance connected to the amplifier output. All or part of the temperature, process, voltage and load impedance information may be determined and supplied to a control circuit that determines the appropriate threshold value for selecting an operating mode of the charge pump and thereby programming the charge pump output voltage. Selection of the operating mode may also select a frequency of operation of the charge pump, an effective size of the switching transistor(s) in the charge pump or a combination thereof, to improve the efficiency of the charge pump under particular operating conditions.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses an audio power amplifier integrated circuit for a consumer audio device that includes a charge-pump power supply for supplying the power supply rails of at least a final power amplifier stage. The power supply voltage generated by the charge-pump power supply is selectable and is set by a mode control circuit that receives indications of the operating environment such as temperature, output load impedance and power supply voltage provided to the integrated circuit and/or an indication of a position of the particular integrated circuit within a process distribution. The indications provide the mode control circuit with information that permits selection of a lower power supply voltage for the audio amplifier, except when the signal level, the particular operating conditions supplied to the integrated circuit, and process-dependent characteristics of the particular integrated circuit dictate that a higher power supply voltage must be provided to the amplifier in order to avoid clipping of the output signal. The efficiency of the charge pump may also be selectable according to the operating mode selection, by varying the switching frequency or the effective size of the switching devices in the charge pump using parallel-connected switching devices.

Figure 1:
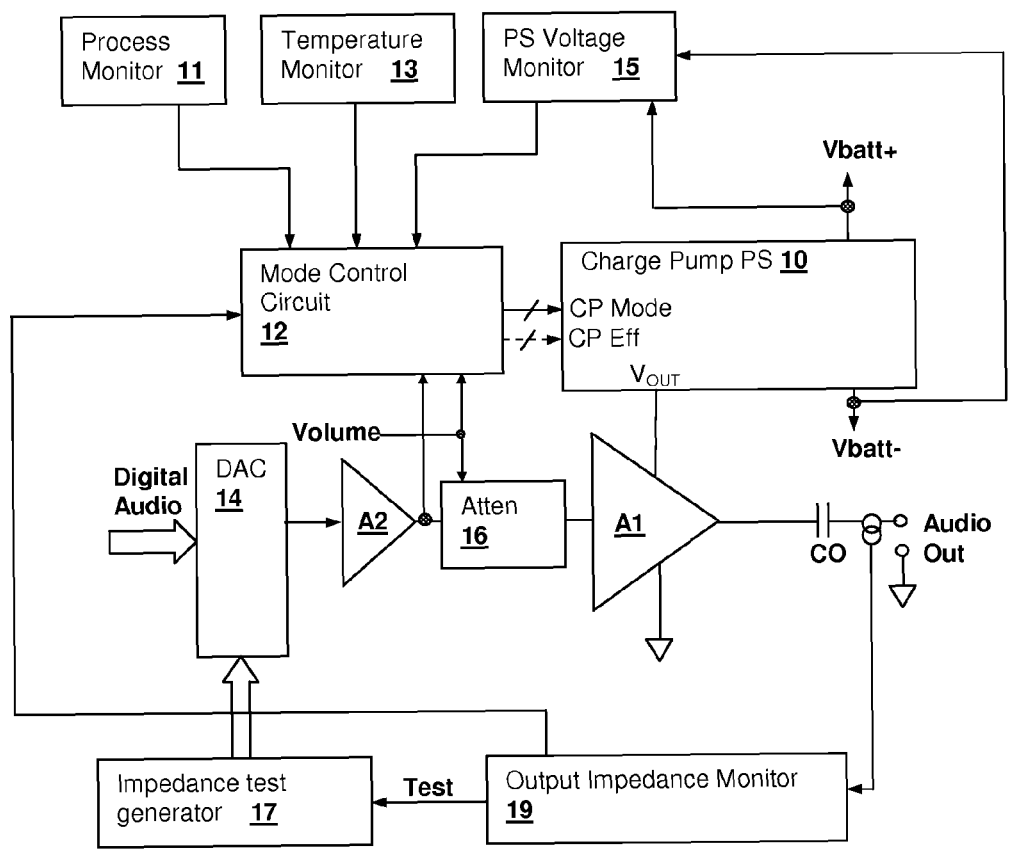
FIG. 1 is a schematic diagram depicting an audio output stage of a consumer audio device in accordance with an embodiment of the invention.

Referring now to FIG. 1, a consumer audio device audio output stage is depicted in accordance with an embodiment of the present invention. A digital-to-analog converter (DAC) 14 supplies an analog signal to a first amplifier stage A2 that is operated from a fixed voltage power supply. The input to DAC 14 is a digital audio source, but that is not a limitation of the present invention, as the techniques of the present invention may be applied to an audio amplifier having a purely analog signal path. The signal at the output of first amplifier stage A2 is provided to an attenuator 16 that receives a volume control signal and attenuates the signal accordingly. Attenuator 16 may be a digital potentiometer having control provided from a microcontroller or other digital control circuit responsive to a user interface, volume knob encoder or program command, or attenuator 16 may be an analog potentiometer that provides the volume control signal as an output indication from a secondary deck (separate potentiometer circuit coupled to the common shaft or other mechanism) for use in the power supply control algorithms described below. While an attenuator 16 is shown as the volume control mechanism, it is understood that an equivalent volume control may be provided by a programmable resistor or adjustable gain in the feedback of amplifier A2 or another amplifier stage in the signal path. A final power amplifier stage A2 amplifies the signal received from attenuator 16 and provides an audio output signal, which may operate a speaker, headphone transducer, and/or a line level signal output. A capacitor CO may be utilized to couple the output signal to the transducer or line level output, particularly if amplifier A1 is operated from a unipolar power supply having a quiescent voltage substantially differing from ground.

Charge pump power supply 10 provides the power supply rail inputs of amplifier A1 and receives a power supply input, generally from a battery or other power supply, depicted as battery terminal connections Vbatt+ and Vbatt−. Mode control circuit 12 supplies a mode select signal CP Mode to charge pump power supply 10, which selects between two or more operating modes of charge pump power supply 10, which select from among two or more values for charge pump power supply output voltage $V_{OUT}$. As described in the above-incorporated U.S. Patent Applications, charge pump power supply output voltage $V_{OUT}$ may be adjusted according to either expected or actual audio signal levels at amplifier output Audio Out. When only low signal levels are present or expected at amplifier output Audio Out, the efficiency of the audio power amplifier integrated circuit is improved by decreasing output voltage $V_{OUT}$ of charge pump power supply 10 according to a decision that the signal level at the output of amplifier A1 is sufficiently low that output voltage $V_{OUT}$ can be reduced without causing clipping.

The power supply voltage requirements of both amplifier A1 and charge-pump power supply 10 are determined not only by the signal amplitude that is required at output Audio Out, but by other limiting characteristics that limit the voltage and current actually delivered to the transducer connected to output Audio Out. The limiting characteristics include the "on" resistance of the devices implementing the output of amplifier A1 and the devices implementing charge pump power supply 10, which are dependent on process and temperature. The limiting characteristics also include the impedance of the load connected to output Audio Out, which dictates the output current required for a given voltage deliverable to output Audio Out, and therefore the voltage drop generated by the above mentioned "on" resistances. Finally, the power supply voltage provided between battery terminal connections Vbatt+ and Vbatt− directly determines the output voltage of charge pump 10 and therefore determines the voltage drop due to the charge-pump switching device "on" resistances that can be permitted for a high level signal at output Audio Out.

In audio amplifier integrated circuit depicted in FIG. 1, mode select signal CP Mode is set in conformity with both signal level information and process/environmental information provided to mode control circuit 12. Within mode control circuit 12, the decision point for selection between operating modes of charge pump power supply 10 is further informed by a process monitor 11, a temperature monitor 13, a power supply voltage monitor 15, and an output impedance monitor 19 that provide mode control circuit 12 with the above-described environmental and process position characteristics. By providing a fully informed decision implemented by lookup tables, a computational algorithm, or combinational logic within mode control circuit 12, the overall efficiency of the audio amplifier integrated circuit can be improved by selecting the higher voltage operating mode(s) of charge pump power supply 10 only when absolutely needed to avoid clipping at the output of amplifier A1, without requiring substantial margins to accommodate full range variations of process, temperature, power supply voltage and load impedance.

As depicted in the illustrated embodiment, output impedance monitor 19 measures current delivered to output Audio Out, via a current mirror, sensing resistor or other technique, during a test mode initiated during a calibration interval (such as during start-up) by a Test signal, which causes a signal of known amplitude to be generated by DAC 14 under stimulus from an impedance test generator 17. The generated signal will generally be a low-level signal to avoid the above-described limiting characteristics having any impact on the generated voltage level at output Audio Out and to minimize any audible artifacts. If the voltage of the signal generated by DAC 14 is known (fixed), then output impedance monitor 19 can then determine the impedance of the output transducer from the current supplied to output Audio Out by the test signal and supply an indication of the load impedance to mode control circuit 12. Alternatively, if the current of the signal generated by DAC 14 is fixed, then the voltage generated across the transducer may be measured and output impedance monitor 19 will measure voltage instead of current. It is understood that combinations of any of the above environmental and process characteristics may improve the decision process and therefore reduce the range of input signal amplitudes for which the higher voltage operating mode (s) must be selected to avoid clipping, and the present invention contemplates "partially-informed" decisions that include less than the full set of process, temperature, power supply voltage and load impedance information used to select the operating mode of charge pump power supply 10.

In order to determine the expected signal amplitudes at amplifier output Audio Out, the volume control signal is supplied to mode control circuit 12 for informing the operating mode selection for charge power supply 10, according to the expected amplitude of the output signal, since higher levels of attenuation or lower levels of gain in the audio signal path will reduce the volume of the signal being amplified and produced at amplifier output Audio Out. Alternatively, or in combination, the output of amplifier A2 is also provided to mode control circuit 12 so that actual signal levels can be measured by mode control circuit 12 and the efficiency of charge pump power supply 10 adjusted in conformity with the power requirements for the actual signal level that will be reproduced at output Audio Out along with the environmental and process information that indicate when a higher voltage at charge pump power supply 10 output voltage $V_{OUT}$ must be selected to produce the required signal level at output Audio Out. In the depicted embodiment, since the volume control is applied after the signal level measurement taken from the output of amplifier A2, the volume information is needed even if the signal level is detected by mode control circuit 12, since mode control circuit 12 must also receive information relating to the amount of gain/attenuation that will be applied to the signal prior to amplification by power amplifier A1.

Figure 2:
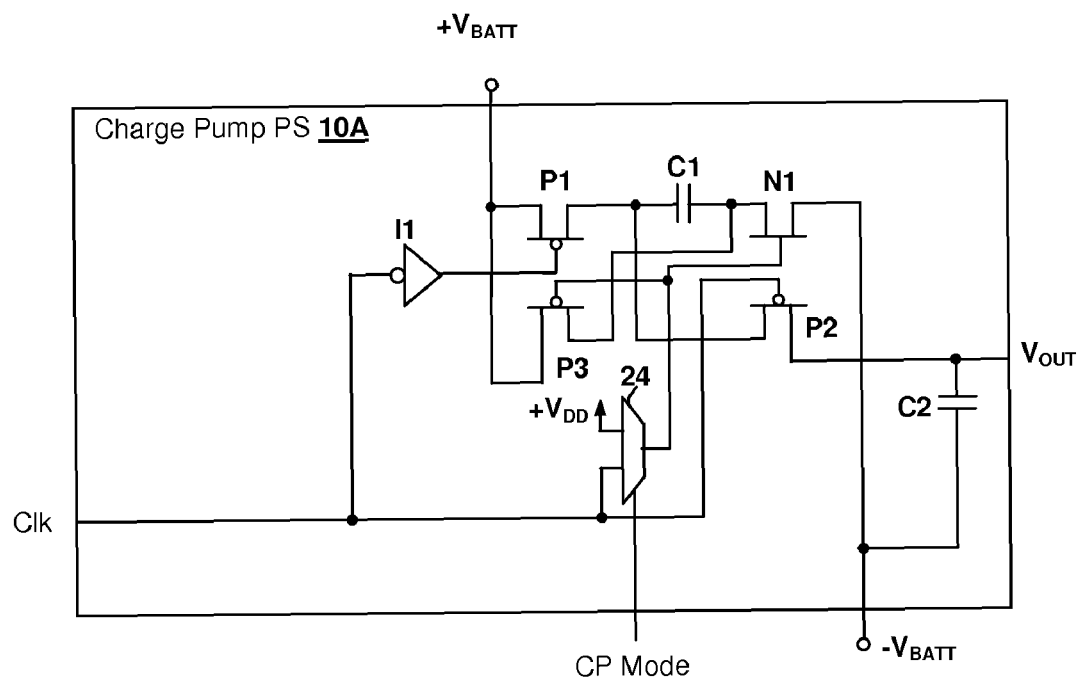
FIG. 2 is a schematic diagram depicting a charge-pump power supply 10A that may be used to implement charge-pump power supply 10 of FIG. 1, in accordance with an embodiment of the invention.

Referring now to FIG. 2, a schematic diagram of a charge pump power supply 10A that may be used to implement charge pump power supply 10 of FIG. 1 is shown. Charge pump power supply 10A has a unipolar output for simplicity of illustration. However, it is understood that techniques according to the present invention may be applied to bipolar charge pumps, such as those disclosed in the above-incorporated U.S. Patent Application "ENERGY-EFFICIENT CONSUMER DEVICE AUDIO POWER OUTPUT STAGE." Switching transistors P1 and N1 control the charging of a flying capacitor C1, which is applied between input terminals $+V_{BATT}$ and $-V_{BATT}$ during a first clock phase of an input clock Clk. An inverter I1 supplies an inverted output of frequency divider 20 to provide the appropriate polarity of the output of frequency divider 20 to switching transistor P1.

In a second phase of input clock Clk, if mode select signal CP Mode is at a logical "0" level, a selector 24 maintains switching transistor N1 in an enabled state and switching transistor P3 in a disabled state. Switching transistor P2 is activated to dump the charge placed on flying capacitor C1 onto output capacitor C2, if the voltage across capacitor C1 exceeds the voltage across output capacitor C2, i.e., if output voltage $V_{OUT}$ has fallen below the voltage at input terminal $+V_{BATT}$. If mode select signal CP Mode is at a logical "1" level, a selector 24 disables switching transistor N1 and enables switching transistor P3 in the second phase of input clock Clk, by supplying input clock Clk to the gates of switching transistors N1 and P3. When mode select signal CP Mode is asserted, switching transistors P2 and P3 are activated during the second phase of input clock Clk to dump the charge placed on flying capacitor C1 onto output capacitor C2 if the voltage across capacitor C1 plus difference between the voltages at input terminals $+V_{BATT}$ and $-V_{BATT}$ exceeds the voltage across output capacitor C2, i.e., if output voltage $V_{OUT}$ has fallen below the twice the value battery voltage across input terminals $+V_{BATT}$ and $-V_{BATT}$.

Therefore, charge pump power supply 10A provides a selectable power supply voltage set by the state of mode select signal CP Mode. The mode select signal provided by mode control circuit 12 of FIG. 1 may be a multi-bit signal that selects between multiple voltage levels for output voltage $V_{OUT}$, which are selected for different ranges of input signal amplitudes and/or volume control level. The thresholds used to decide the selected value for output voltage $V_{OUT}$ can each be informed by process monitor 11, temperature monitor 13, power supply voltage monitor 15 and output impedance monitor 19 to provide the most efficient operation available while avoiding clipping at the output of power amplifier A1 under the particular environmental conditions and process position of the particular integrated circuit.

Figure 3:
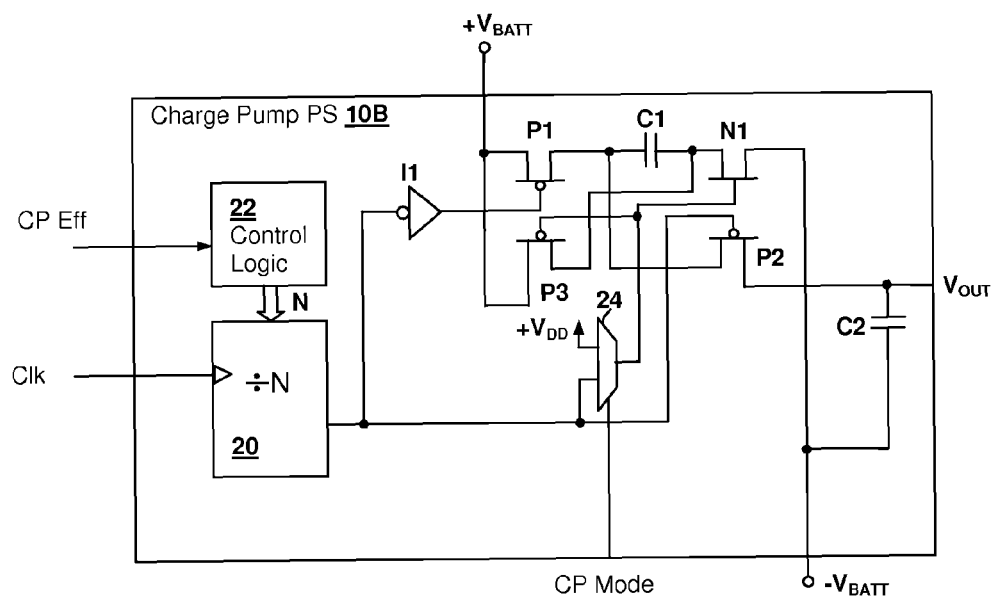
FIG. 3 is a schematic diagram depicting a charge-pump power supply 10B that may be used to implement charge-pump power supply 10 of FIG. 1, in accordance with an embodiment of the invention.

Referring now to FIG. 3, a schematic diagram of a charge pump power supply 10B that may alternatively be used to implement charge pump power supply 10 of FIG. 1 is shown. Charge pump power supply 10B is similar to charge pump power supply 10A of FIG. 2, and therefore only differences between them will be described below. In charge pump power supply 10B, not only is output voltage $V_{OUT}$ selected according to expected/actual audio signal amplitudes, but the efficiency of charge pump power supply 10B itself is selected according to the expected/actual audio signal amplitudes as disclosed in the above-incorporated U.S. patent application entitled: "SIGNAL LEVEL SELECTED EFFICIENCY IN A CHARGE PUMP POWER SUPPLY FOR A CONSUMER DEVICE AUDIO POWER OUTPUT STAGE." Additionally, in the present invention, the decision point(s) for selecting the efficiency of charge pump power supply 10B may be adjusted in conformity with the environmental and process information provided to mode control circuit 12 of FIG. 1 from process monitor 11, temperature monitor 13, power supply voltage monitor 15 and output impedance monitor 19, to further improve the overall efficiency of the audio power amplifier integrated circuit depicted in FIG. 1.

In charge pump power supply 10B of FIG. 3, the clock phases used to control switching transistors P1-P3 and N1 are derived from clock signal Clk by a frequency divider 20 that divides the frequency of an input clock Clk by a factor N. A control logic 22 receives one or more Mode Select signals and programs frequency divider 20 according to factor N, to set the switching frequency at the output of frequency divider 20, so that in one or more higher efficiency modes, the switching frequency is reduced (i.e., factor N is greater) and in a higher power mode, factor N is a minimum and charge pump power supply 10A is operated at a maximum switching frequency. The internal power consumption of charge pump power supply 10B, and therefore the efficiency of charge pump power supply 10B increases with increasing size of the switching devices within charge pump power supply 10B and also with the frequency of switching. The internal power consumption of charge pump power supply 10B due to charging and discharging the gates of the switching transistors can be expressed as $CV^2F_s$, where C is the total gate capacitance of the switching transistors being switched at each half-period of switching frequency $F_s$ and V is the voltage swing at the gates of the switching transistors.

When the voltage required at the power supply input terminals of power amplifier A1 for a particular audio signal level does not approach the actual selected charge pump power supply 10B output voltage $V_{OUT}$, e.g., when the required voltage is at the bottom or near the middle of the range provided by a particular selectable value for output voltage $V_{OUT}$, the frequency provided by frequency divider 20 can be reduced, allowing output voltage $V_{OUT}$ to drop below a maximum value. Table I, below, illustrates a possible configuration of threshold values (e.g., required power supply for amplifier A1) for selecting charge pump power supply voltage and operating frequency for a charge pump power supply having two selectable levels for an ideal value of output voltage $V_{OUT}$ (2V and 1V) and two selectable charge pump operating frequency division factors N=1 and N=2. By ideal value of output voltage $V_{OUT}$, the table indicates a value for $V_{OUT}$ without substantial additional losses introduced, for example, by lowering the frequency of operation of the charge pump to where losses begin to increase. However, such illustration does not preclude the possibility that a design could use two or more less-than-ideal operating frequencies for a charge-pump power supply and select between those levels as a function of input signal level and environment/process determinations.

TABLE I

| Threshold (Required A1 power supply) | N | Ideal $V_{OUT}$ | CP Mode | CP Eff |
|---|---|---|---|---|
| 1.9 | 1 | 2 | 1 | 1 |
| 1.0 | 2 | 2 | 1 | 0 |
| 0.9 | 1 | 1 | 0 | 1 |
| — | 2 | 1 | 0 | 0 |

In Table I, there is no threshold for the lowest frequency/lowest power supply voltage range in which N=2 and $V_{OUT}$=1, which is the default operating mode (CP Mode="0", CP Eff="0") without an indication that the signal level required from power amplifier A1 may cause clipping of the audio output signal. The frequency selection, which is performed in response to a charge-pump power supply efficiency selection signal CP Eff, is illustrated as mandating the higher switching frequency (N=1) when the required charge pump power supply output voltage $V_{OUT}$ is within 0.1V of the ideal output voltage of the charge pump. The 0.1V margin between the thresholds that determine the state of efficiency selection signal CP Eff account for a maximum "droop" in charge pump power supply 10 output voltage $V_{OUT}$ of 0.1V, which will increase above 0.1V due to lower "charge pumping" rate of the charge pump when the lower switching frequency is selected.

Figure 4:
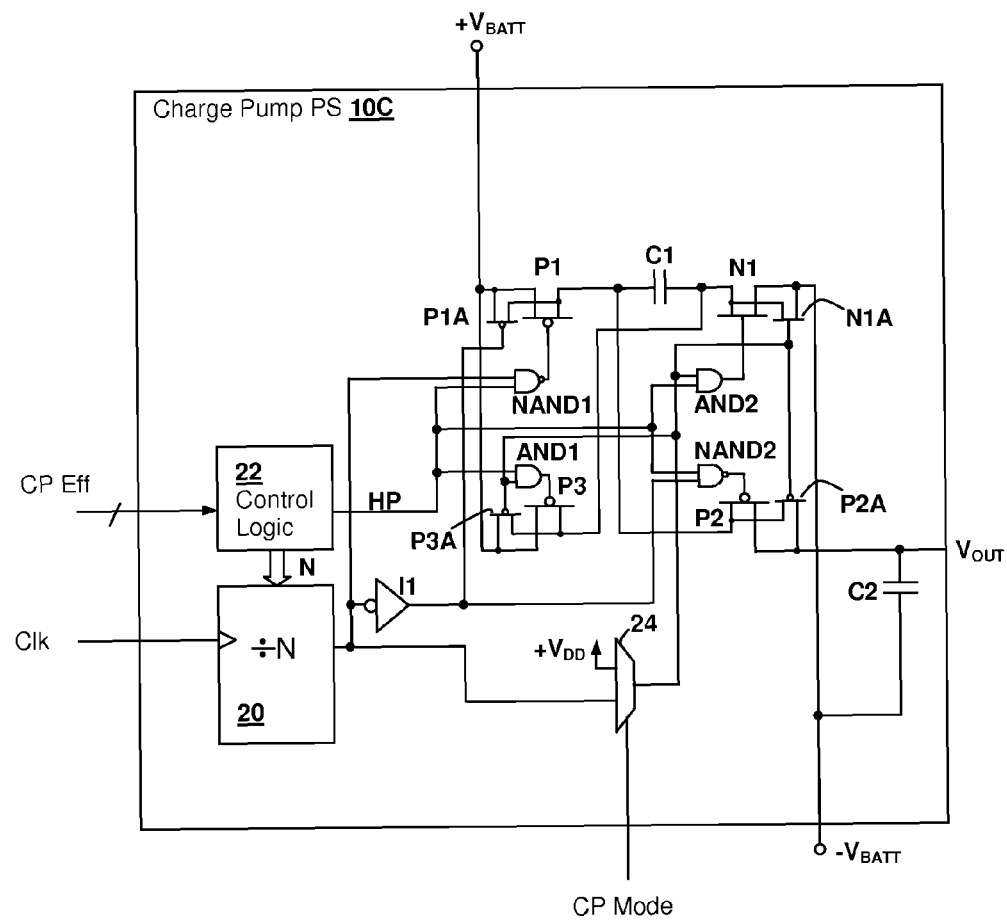
FIG. 4 is a schematic diagram depicting a charge-pump power supply 10C that may be used to implement charge-pump power supply 10 of FIG. 1, in accordance with an embodiment of the invention.

Referring now to FIG. 4, a schematic diagram of a charge pump power supply 10C that may alternatively be used to implement charge pump power supply 10 of FIG. 1 is shown. Charge pump power supply 10C is similar to charge pump power supply 10A of FIG. 2 as described above, so only differences between them will be described below. Each of switching transistors P1, P2, P3 and N1 has a drain-source connection connected in parallel to a corresponding smaller area switching transistor P1A, P2A, P3A or N1A. The gates of smaller area switching transistors P1A, P2A, P3A and N1A are controlled by the same clock phase signals described above with respect to FIG. 2 and are operated continuously when charge pump power supply 10C is operating in the voltage doubler mode (CP Mode=1). When signal CP Mode=0, as in charge pump 10B of FIG. 3, transistor P3A is disabled and transistor N1A remains enabled for both clock phases, according to selection of signals by selector 24. Switching transistors P1, P2, P3 and N1 are operated only when a high power mode signal HP is asserted by control logic 22, by masking clock phase outputs of frequency divider 20 and inverter I1 using logical-AND gates AND1 and AND2 along with logical-NAND gates NAND1 and NAND2. High power mode signal HP is determined by control logic from one or more charge pump efficiency select signals CP Eff. The resulting operation of charge pump power supply 10C reduces the effective gate capacitance of the switching transistors in charge pump power supply 10B when control signal HP is de-asserted, since the gate capacitances of switching transistors P1, P2, P3 and N1 are not being charged and discharged in the resulting high efficiency mode.

In the exemplary embodiment of FIG. 4, the frequency of operation of charge pump power supply 10C is also altered according to charge pump efficiency selection signal(s) CP Eff, but that is not a requirement of the present embodiment, as the efficiency of charge pump power supply 10C can be improved under certain environmental and process characteristics and for low amplitude amplifier output signals by reduction of effective gate capacitance alone. Therefore, frequency divider 20 is not required to implement a charge pump power supply having selectable efficiency that may be used in embodiments of the present invention. Further, the switching transistor sets may be mutually-exclusive, so that for example, small area switching transistors P1A, P2A, P3A and N1A could be disabled while larger area switching transistors P1, P2, P3 and N1 are actively switched.

Figure 5:
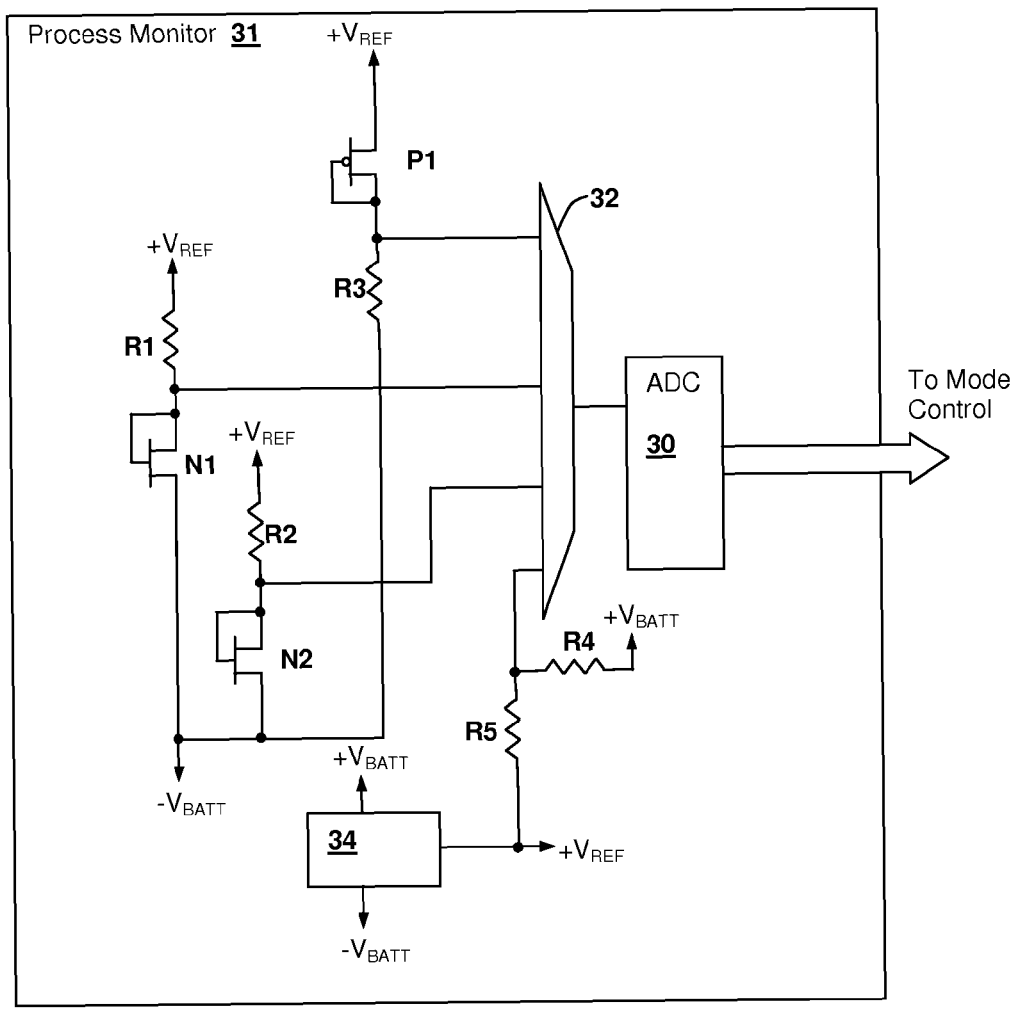
FIG. 5 is a schematic diagram depicting a process monitor circuit 31 that may be used to implement process monitor 11 of FIG. 1, in accordance with an embodiment of the invention.

Referring now to FIG. 5, a process monitor circuit 31 that can be used to implement process monitor 11 of FIG. 1 is shown. Transistors N1, N2 and P1 having different threshold voltage characteristics and types as used in charge-pump power supply 10 and amplifier A1 are connected in diode configurations and each in series with corresponding polysilicon resistors R1-R3. A selector 32 selects between the transistor circuits and an ADC having an input provided by selector 32 measures the voltage generated across resistors R1-R3 in turn, providing information describing the characteristics of each of transistors N1, N2 and P1 and therefore the particular position of the integrated circuit (and the individual devices) within a process distribution of the integrated circuit over the manufacturing process. Process monitor 31 also includes the function of power supply voltage monitor 15, by measuring the difference between reference voltage +$V_{REF}$ provided a voltage reference circuit 34 that supplies the process monitoring circuits as described above and temperature monitoring circuits as will be described below, and the positive battery terminal voltage $+V_{BATT}$, which gives an indication of the magnitude of the full battery voltage as reference voltage $+V_{REF}$ is referenced to negative battery terminal voltage $-V_{BATT}$. A fourth input to selector 32 provides for measuring the output of a voltage divider formed by resistors R4 and R5, that is indicative of the battery voltage provided to charge pump power supply 10.

Figure 6:
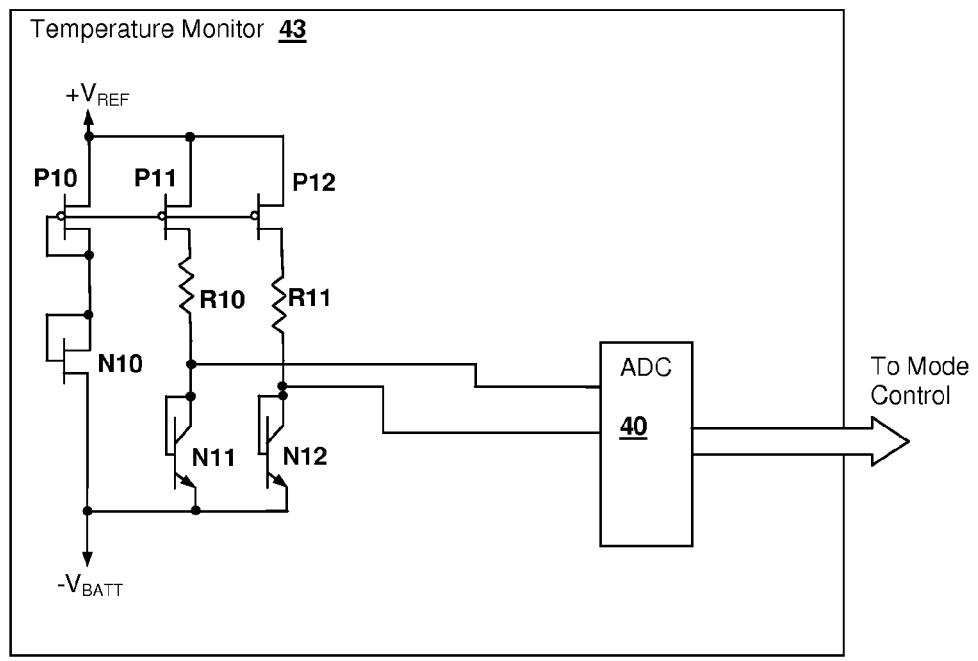
FIG. 6 is a schematic diagram depicting a temperature monitor circuit 43 that may be used to implement temperature monitor 13 of FIG. 1, in accordance with an embodiment of the invention.

Referring now to FIG. 6, an exemplary temperature monitor 43 as may be used to implement temperature monitor 13 of FIG. 1 is illustrated. A current mirror formed by transistors P10-P12 provides either different current levels set by a transistor N10 to bipolar transistors N11 and N12 of the same size, or the same current levels to bipolar transistors N11 and N12 of differing sizes (or having multiple same-sized transistors connected in parallel to implement the device). By measuring the difference in the saturated collector-emitter voltage $V_{CE}$ of transistors N11 and N12 knowing the relative current supplied to the transistors through resistors R10 and R11 (or the relative sizes of the transistors when identical currents are used), the temperature of transistors N11 and N12 can be determined from the difference between the collector-emitter voltages. ADC 40 is used to measure collector-emitter voltages $V_{CE}$ or the difference directly and may be the same ADC used to make other measurements such as the process monitoring measurements described above, with appropriate multiplexing.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. An audio amplifier integrated circuit for providing an output signal to an audio transducer, the audio amplifier circuit comprising:
    a power amplifier having an audio input for receiving an audio input signal, an audio output for providing the output signal, and a pair of power supply rail connections;
    a charge pump power supply for providing a power supply voltage across the pair of power supply rail connections of the power amplifier, wherein the charge pump power supply has a selectable operating mode for selecting a magnitude of the power supply voltage; and
    a control circuit for selecting the operating mode of the charge pump power supply in conformity with an indication of an amplitude of the audio input signal and further in conformity with an indication of an operating environment of the audio amplifier integrated circuit or a position within a process variation range of the audio amplifier integrated circuit, whereby efficiency of the audio amplifier integrated circuit is improved while clipping of the output signal is prevented.

2. The audio amplifier integrated circuit of claim 1, wherein the indication of the operating environment includes an indication of a temperature of the audio amplifier integrated circuit, wherein the audio amplifier integrated circuit further comprises a temperature detector for generating the indication of the temperature of the audio amplifier integrated circuit, and wherein the control circuit selects the operating mode of the charge pump power supply in conformity with the indication of the temperature.

3. The audio amplifier integrated circuit of claim 1, wherein the indication of the operating environment includes an indication of a magnitude of an input supply voltage provided to the charge pump power supply, wherein the audio amplifier integrated circuit further comprises a voltage measurement circuit for generating the indication of the magnitude of the input supply voltage, and wherein control circuit selects the operating mode of the charge pump power supply in conformity with the indication of the magnitude of the input supply voltage.

4. The audio amplifier integrated circuit of claim 1, further comprising a process monitor circuit for determining the indication of the position within the process variation range of the audio amplifier integrated circuit, and wherein the control circuit selects the operating mode of the charge pump power supply in conformity with the indication of the position within the process variation range of the audio amplifier integrated circuit.

5. The audio amplifier integrated circuit of claim 1, wherein the indication of the operating environment includes an indication of a magnitude of an impedance of the audio transducer, and wherein the control circuit selects the operating mode of the charge pump power supply in conformity with the indication of the magnitude of the transducer impedance.

6. The audio amplifier integrated circuit of claim 5, further comprising a load impedance measurement circuit operable during a calibration interval to generate a signal of predetermined amplitude at the audio output and measure a current drawn by or voltage generated across the transducer in response to the signal.

7. The audio amplifier integrated circuit of claim 1, wherein the indication of the operating environment of the audio amplifier integrated circuit includes an indication of a magnitude of an input supply voltage provided to the charge pump power supply and an indication of a temperature of the audio amplifier integrated circuit, wherein the audio amplifier integrated circuit further comprises:
    a voltage measurement circuit for generating the indication of the magnitude of the input supply voltage; and
    a temperature detector for generating the indication of the temperature of the audio amplifier integrated circuit, and wherein the control circuit selects the operating mode of the charge pump power supply in conformity with the indication of the magnitude of the input supply voltage and the indication of the temperature of the audio amplifier integrated circuit.

8. The audio amplifier integrated circuit of claim 7, further comprising a process monitor circuit for determining the indication of the position within the process variation range of the audio amplifier integrated circuit, and wherein the control circuit further selects the operating mode of the charge pump power supply in conformity with the indication of the position within the process variation range of the audio amplifier integrated circuit.

9. The audio amplifier integrated circuit of claim 1, wherein the charge pump power supply has a selectable internal efficiency, and wherein the control circuit further selects the internal efficiency of the charge pump power supply in conformity with the indication of the amplitude of the audio input signal and the indication of the operating environment of the audio amplifier integrated circuit or the position within the process variation range of the audio amplifier integrated circuit.

10. An audio amplifier integrated circuit for providing an output signal to an audio transducer, the audio amplifier circuit comprising:

a power amplifier having an audio input for receiving an audio input signal, an audio output for providing the output signal, and a pair of power supply rail connections;

a charge pump power supply for providing a power supply voltage across the pair of power supply rail connections of the power amplifier, wherein the charge pump power supply has a selectable operating mode for selecting a magnitude of the power supply voltage;

a voltage measurement circuit for generating the indication of the magnitude of the input supply voltage;

a temperature detector for generating the indication of the temperature of the audio amplifier integrated circuit;

a process monitor circuit for determining the indication of the position within the process variation range of the audio amplifier integrated circuit;

a load impedance measurement circuit for generating an indication of a magnitude of an impedance of the transducer; and a control circuit for selecting the operating mode of the charge pump power supply in conformity with an indication of an amplitude of the audio input signal, the indication of the magnitude of the input supply voltage, the indication of the temperature of the audio amplifier integrated circuit, the indication of the magnitude of the external load impedance and the indication of the position of the audio amplifier integrated circuit with the process variation range of the audio amplifier integrated circuit, whereby efficiency of the audio amplifier integrate circuit is improved while clipping of the output signal is prevented.

11. A method of improving efficiency of an audio amplifier integrated circuit for providing a power output to an audio transducer, the method comprising:

receiving an indication of a magnitude of a signal to be amplified by the amplifier;

selecting an operating mode of a charge pump power supply in conformity with the received indication of the magnitude of the signal to be amplified and further in conformity with an indication of an operating environment or position within a process variation range of the audio amplifier integrated circuit; and supplying a power supply voltage to the amplifier from the charge pump power supply in conformity with the selected operating mode.

12. The method of claim 11, further comprising measuring an indication of a temperature of the audio amplifier integrated circuit, and wherein the selecting is performed in conformity with the indication of the temperature.

13. The method of claim 11, further comprising measuring a magnitude of an input supply voltage provided to the charge pump power supply, and wherein the selecting is performed in conformity with the indication of the magnitude of the input supply voltage.

14. The method of claim 11, further comprising determining the indication of the position within the process variation range of the audio amplifier integrated circuit, and wherein the selecting is performed in conformity with the indication of the position within the process variation range of the audio amplifier integrated circuit.

15. The method of claim 11, further comprising measuring an indication of a magnitude of an impedance of the transducer, and wherein the selecting is performed in conformity with the indication of the load impedance of the transducer.

16. The method of claim 15, wherein the measuring is performed during a calibration interval by generating a signal of predetermined amplitude at the transducer and measuring a current drawn by or voltage generated across the transducer in response to the signal.

17. The method of claim 11, wherein the indication of the operating environment of the audio amplifier integrated circuit includes an indication of a magnitude of an input supply voltage provided to the charge pump power supply and an indication of a temperature of the audio amplifier integrated circuit, and wherein the method further comprises:

first measuring an indication of a temperature of the audio amplifier integrated circuit;

second measuring a magnitude of an input supply voltage provided to the charge pump power supply, and wherein selecting selects the operating mode of the charge pump power supply in conformity with the indication of the magnitude of the input supply voltage and the indication of the temperature of the audio amplifier integrated circuit.

18. The method of claim 17, further comprising determining the indication of the position within the process variation range of the audio amplifier integrated circuit, and wherein the selecting is further performed in conformity with the indication of the position within the process variation range of the audio amplifier integrated circuit.

19. The method of claim 17, further comprising measuring an indication of a magnitude of an impedance of the transducer, and wherein the selecting is further performed in conformity with the indication of the load impedance of the transducer.

20. The method of claim 19, wherein the measuring is performed during a calibration interval by generating a signal of predetermined amplitude at the transducer and measuring a current drawn by or voltage generated across the transducer in response to the signal.

21. The method of claim 11, wherein the selecting an operating mode of the charge pump power supply further selects an internal efficiency of the charge pump power supply in conformity with the received indication of the magnitude of the signal to be amplified and further in conformity with the indication of the operating environment or position within the process variation range of the audio amplifier integrated circuit.

* * * * *